United States Patent
Waller, Jr. et al.

(10) Patent No.: US 8,565,447 B2
(45) Date of Patent: Oct. 22, 2013

(54) ACTIVE INSTRUMENT SUBWOOFER SYSTEM FOR LOW FREQUENCY ENHANCEMENT

(76) Inventors: James K. Waller, Jr., Clarkston, MI (US); Jon J. Waller, Waterford, MI (US)

(*) Notice: Subject to any disclaimer, the term of this patent is extended or adjusted under 35 U.S.C. 154(b) by 3141 days.

(21) Appl. No.: 10/886,853

(22) Filed: Jul. 8, 2004

(65) Prior Publication Data

US 2006/0005694 A1   Jan. 12, 2006

(51) Int. Cl.
 *H03G 5/00* (2006.01)
(52) U.S. Cl.
 USPC ............................. 381/98; 381/99; 381/118
(58) Field of Classification Search
 USPC ............. 381/1, 56, 58, 96, 97, 300–305, 381/98–109, 118, 120
 See application file for complete search history.

(56) References Cited

U.S. PATENT DOCUMENTS

| | | | | |
|---|---|---|---|---|
| 4,408,095 A | * | 10/1983 | Ariga et al. | 381/302 |
| 4,752,744 A | * | 6/1988 | Aoki | 330/252 |
| 4,937,874 A | * | 6/1990 | Pittman et al. | 381/61 |
| 5,361,381 A | * | 11/1994 | Short | 381/80 |
| 5,533,135 A | | 7/1996 | Gary | |
| 6,169,812 B1 | | 1/2001 | Miller | |
| 6,263,083 B1 | * | 7/2001 | Weinreich | 381/97 |
| 7,088,833 B1 | * | 8/2006 | Kling | 381/97 |
| 7,292,697 B2 | * | 11/2007 | Tatsuta et al. | 381/302 |
| 7,894,614 B2 | * | 2/2011 | Cordell | 381/103 |
| 2004/0047479 A1 | * | 3/2004 | Porzilli et al. | 381/182 |

* cited by examiner

*Primary Examiner* — Vivian Chin
*Assistant Examiner* — Fatimat O Olaniran
(74) *Attorney, Agent, or Firm* — Gable Gotwals

(57) ABSTRACT

An instrument amplification system provides improved low frequency enhancement. A powered subwoofer system enhances the low frequency components of a standard instrument amplifier by incorporating a speaker level high-pass filter crossover network prior to connection to a standard instrument speaker. The speaker level instrument amplifier output is also attenuated, low-pass filtered and re-amplified to drive a dedicated low frequency subwoofer speaker. In one embodiment, a single speaker cabinet connects via a single speaker cable and includes both typical instrument speakers and an active powered subwoofer system. In another embodiment, a stand alone active powered subwoofer connects to a standard instrument amplifier and includes a speaker level high-pass crossover output for connection to a standard instrument speaker cabinet. The instrument amplifier speaker output is attenuated, low-pass filtered, re-amplified and connected to a low frequency subwoofer speaker. A differential attenuator is incorporated allowing connection to instrument amplifiers with differential bridge outputs.

6 Claims, 4 Drawing Sheets

ACTIVE INSTRUMENT SUBWOOFER SYSTEM FOR LOW FREQUENCY ENHANCEMENT

BACKGROUND OF THE INVENTION

The present invention relates to a method and system for providing low frequency enhancement for a musical instrument amplification system. Electric instruments and instrument amplification has been in use for many years with continued evolution and improvement in sound quality. Guitar amplification in particular has seen several evolutionary changes such as increases in output power and improvements in speaker technology. For many years there has been a desire to increase the amount of usable gain in the amplifier in an attempt to provide the musician use of a highly saturated and distorted sound. In recent years a growing number of musicians are using 7-string guitars and or detuning the instrument to provide a lower deeper sound. Instrument amplifier technology has not kept up with the musicians desire to reproduce these low frequencies provided by the 7-string or detuned guitar. Most guitar and instrument amplifiers fall far short of the ability to reproduce the fundamental frequency of even the de-tuned standard 6 string guitar and few if any can reproduce the fundamental frequency of a de-tuned 7-string guitar. Limited attempts have been made to provide a guitar amplifier capable of reproducing the lowest frequencies of the instrument. One prior art system in use as far back as the 1960's was produced by a well-known guitar/amplifier company, Gibson, and offered a self-contained guitar amplifier called the "Medalist". This combo amplifier, an instrument amplifier that includes the instrument preamp, power amplifier and speakers in one package, provided an internal crossover network used for separating the audio spectrum into low and high frequency signals. A 15-inch woofer reproduced the low frequencies, and a 10-inch mid-high frequency speaker reproduced the high frequency signals.

In recent years instrument amplification systems incorporating a separate external active subwoofer or a speaker cabinet with an internal active subwoofer amplifier have started to appear. One major shortcoming of these systems is that the crossover network, which is required to provide a proper separation and balance between the high and low frequency bands, has been incorporated in the guitar amplifier. This provides a closed loop system requiring the musician to use both the manufacturers guitar amplifier and subwoofer speaker together as a composite system. Many musicians prefer the sound of one specific instrument amplifier. However, a closed loop system with the crossover in the instrument amplifier, as described above, will not facilitate the option to use any instrument amplifier with the active instrument subwoofer system. Furthermore, the current systems also require multiple connections between the instrument amplifier and the subwoofer speaker system, complicating the use of the system and making any desired expansion of the system difficult.

SUMMARY OF THE INVENTION

In accordance with the present invention a system and method is disclosed for enhancing the low frequency components of a standard instrument amplification system by incorporating a speaker level high-pass crossover network prior to connection to a standard instrument speaker. The speaker level instrument amplifier output is also attenuated, low-pass filtered and re-amplified to drive a dedicated low frequency subwoofer speaker. One of the objects of the current invention is to provide a single connection between any standard instrument amplifier and the active subwoofer system, thus allowing for easy expandability by adding additional speaker cabinets in the system. A further object of the invention is to allow the musician to use any instrument amplifier and instrument speaker cabinets and to easily add to their system an external active subwoofer providing the desired low frequency enhancement. Another object of the invention is to incorporate the use of a speaker level attenuator allowing the direct speaker output of the instrument amplifier to be attenuated, low pass filtered and re-amplified to drive a dedicated low frequency subwoofer speaker. A further object of the invention is to allow the use of newer model instrument amplifiers incorporating a differential power amplifier output to feed the input of the active instrument subwoofer system without concern of shorting or grounding one of the amplifier outputs. Yet another object of the present invention is to provide user selectable impedance-crossover matching allowing properly matched crossover frequency response when using any external instrument speaker cabinet.

BRIEF DESCRIPTION OF THE DRAWINGS

Other objects and advantages of the invention will become apparent upon reading the following detailed description and upon reference to the drawings in which.

While the invention will be described in connection with preferred embodiments, it will be understood that it is not intended to limit the invention to those embodiments. On the contrary, it is intended to cover all alternatives, modifications and equivalents as may be included within the spirit and scope of the, invention as defined by the appended claims.

DETAILED DESCRIPTION OF THE INVENTION

Figure 1:
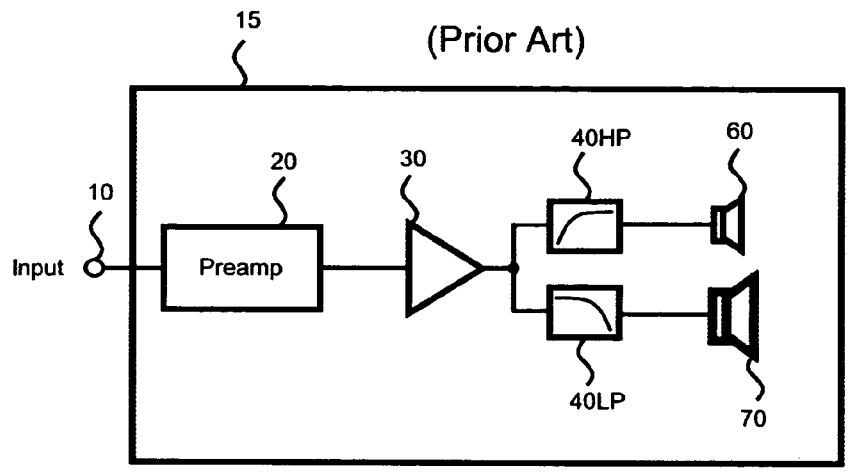
FIG. 1 is a block diagram of the prior art first made available in the 1960's.

Referring to FIG. 1, a block diagram of an early prior art system is shown. Gibson originally sold the system shown in FIG. 1 in the 1960's under the product name "Medalist". The block diagram of FIG. 1 shows a fully contained combo amplifier 15 with an input connection 10 feeding the input of a preamplifier 20. The output of the preamplifier 20 feeds the input of a power amplifier 30, which increases the output voltage and current to a level required to drive speakers. The output of the power amplifier 30 is divided by a crossover network 40 into high-band and low-band signals by a high-pass filter 40HP and a low-pass filter 40LP. The output of the high-pass filter 40HP connects to a high frequency speaker 60 and the output of the low-pass filter connects to a low frequency woofer 70. While this system was one of the first systems incorporating separate high and low frequency speakers the system used speaker level passive crossover components for both high and low pass functions and also lacked the ability to separately adjust the level of the low frequency portion of the spectrum.

Figure 2:
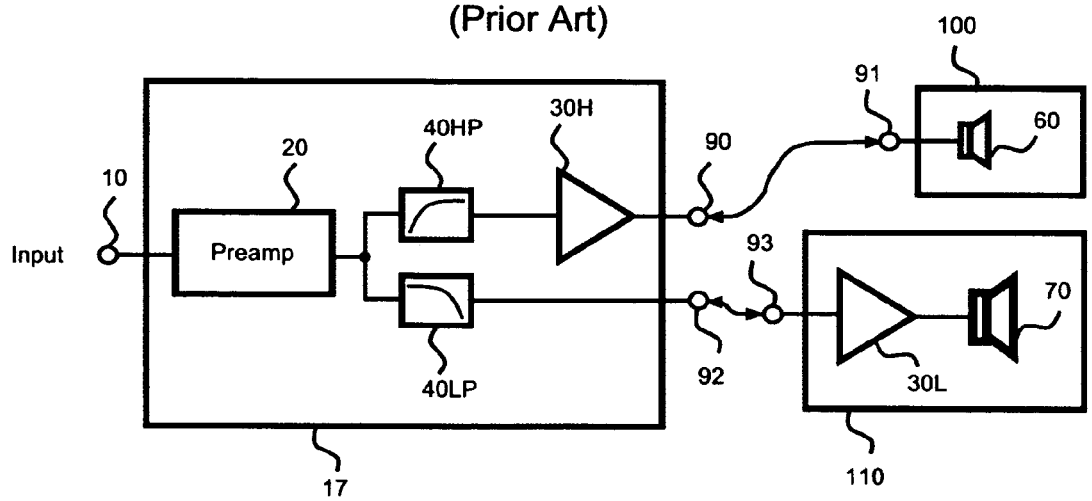
FIG. 2 is a block diagram of a prior art system incorporating an external active subwoofer.

FIG. 2 shows a block diagram of a prior art system disclosed in U.S. Pat. No. 5,814,752 where the crossover network 40 is incorporated in the instrument amplifier 17. The input signal is applied at the input 10, which feeds the input of the instrument preamplifier 20. The output of the instrument preamplifier 20 is applied to the crossover network 40 whereby the preamp output signal is high-pass filtered by a filter 40HP and low-pass filtered by a filter 40LP. The output of the low-pass filter 40LP is applied directly to a special output connector 92 and allows the connection of an external active power amplified subwoofer 110, which includes an internal power amplifier 30L and the woofer speaker 70. The high-pass filtered output is applied to the input of the internal power amplifier 30H, the output of which is connected to an output connector 90. The high-pass filtered, amplified signal at 90 is applied to an external speaker cabinet 100, which may include single or multiple speakers 60.

Figure 3:
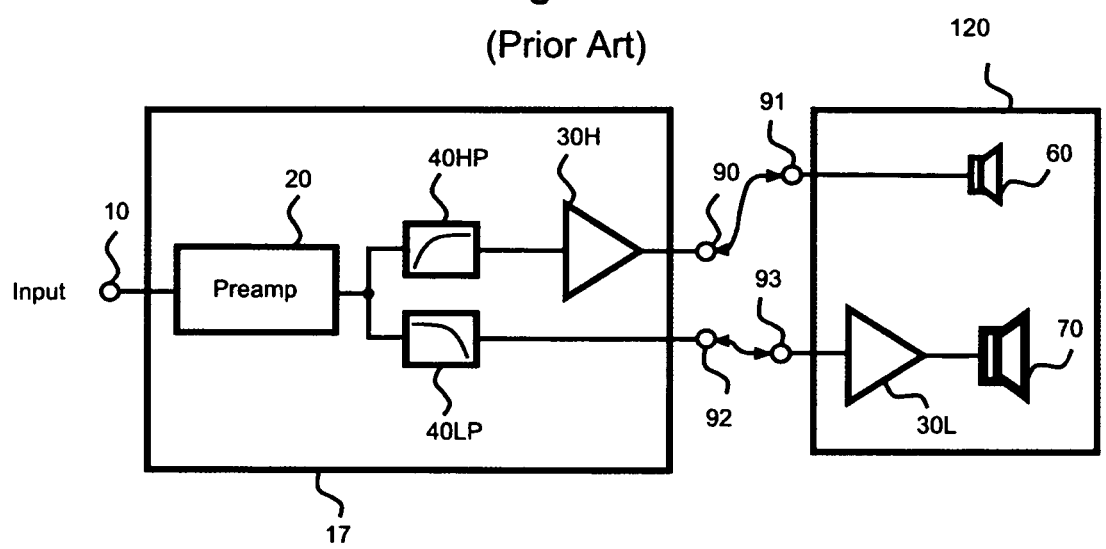
FIG. 3 is a block diagram of a prior art system incorporating an external speaker cabinet with both standard instrument speakers and an active subwoofer in the same speaker cabinet.

Referring to FIG. 3, a block diagram of a single speaker cabinet system based on the '752 patent is shown. It is understood that block 17 of FIG. 3 is identical to that of block 17 in FIG. 2. Instrument amplifier 17 includes the preamplifier 20, which receives an input signal from the input connector 10. The output of preamp the 20 feeds the input of the crossover network 40 where the high-pass filter 40HP removes the low frequency audio from the preamp output signal and the low-pass filter 40LP removes the high frequency audio from the preamp output signal. The low-pass filtered output appears at the output jack 92. The output signal of the high-pass filter 40HP is fed to the input of the internal amplifier 30H with the output of that amplifier 30H appearing at the output connector 90. The high-pass and low-pass filtered output signals of the instrument amplifier 17 appear at the output jacks 90 and 92. Both of these outputs are connected to a speaker cabinet 120 where the high-pass filtered, amplified output 90 is connected to a connector 91, which feeds a standard instrument speaker or multiple instrument speakers 60. The low-pass filtered output at jack the 92 is connected to a speaker cabinet input 93, which is applied to the input of the internal power amplifier 30L. The output of the internal power amplifier 30L is applied to the low-frequency subwoofer speaker 70.

While the teachings of the '752 patent offer an improvement over the prior art shown in FIG. 1, there are still many shortcomings. For example, the system of FIG. 2 does not allow the musician to use his or her favorite instrument amplifier. The system shown in FIG. 3 can only be realized by using the instrument amplifier and speaker cabinet offered from a single manufacturer, which may not offer the musician the desired tonal performance. Furthermore, the FIG. 3 system requires multiple connections between the instrument amplifier and speaker cabinet and therefore does not allow easy expandability if the musician is interested in using multiple speaker cabinets.

Figure 4:
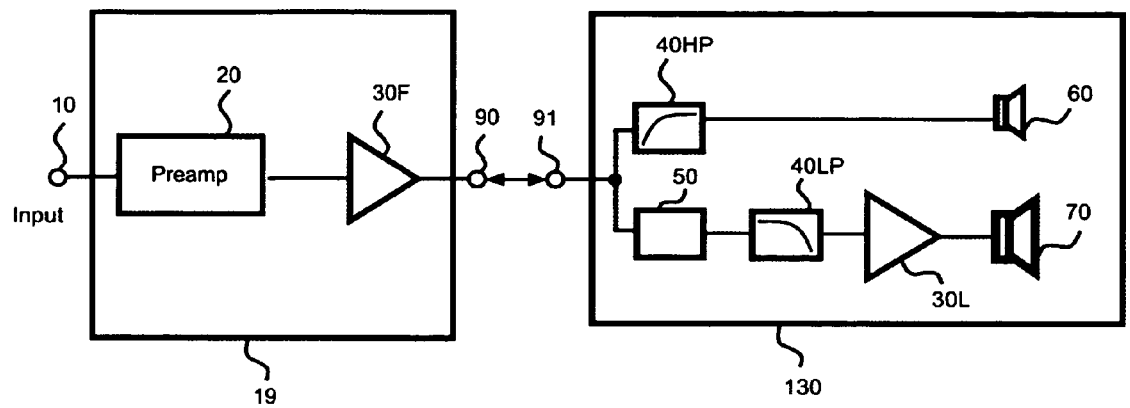
FIG. 4 is a block diagram of a first embodiment of the invention.

Referring now to FIG. 4, a first embodiment of the current invention is shown where block 19 may be any commonly used instrument amplifier, which includes the preamplifier 20 receiving its input signal from the input connector 10. The output of the preamplifier 20 is a full-range signal including the entire spectrum of the signal. The full-range output of the preamp 20 feeds an internal full-range amplifier 30F whose output signal appears at the output connector 90. The full-range amplified signal at the connector 90 is connected via a single speaker connector to the input connector 91 of a speaker system 130. The signal at the input connector 91 is fed to both the high-pass filter 40HP and the attenuator 50. The input signal attenuator 50 can be either a simple single ended attenuator or, as will be described in greater detail with respect to FIG. 6, may alternatively be a differential attenuator allowing for the connection of an instrument amplifier incorporating a differential or bridge output power amplifier design. The attenuator 50 reduces the amplitude of the power amplifier 30F approximately 30 db, providing an output signal level at a line level reference. The line level output of the attenuator 50 is applied to the input of the low-pass filter 40LP. The output of low-pass filter 40LP feeds the input of the internal power amplifier 30L. The output of the low-pass filter 40LP is re-amplified by the amplifier 30L and the output signal of the amplifier 30L is directly connected to the subwoofer speaker 70. It is understood that the subwoofer speaker 70 may be any speaker designed for low frequency woofer applications. The typical crossover point of the system is between 80 Hz and 200 Hz, but it will be apparent to those skilled in the art that other crossover frequencies may be used if the speakers used are capable of accurately reproducing the required frequency band. It will also be apparent to the skilled artisan that, while the typical crossover attenuation slope of the system is 6 db per octave, higher order crossover slopes may be used without changing the scope of the invention. Referring again to FIG. 4, the high-pass filter 40HP is implemented at a power amplified level and may be a single capacitor providing a 6 db per octave attenuation slope or an LC circuit providing higher order slopes. The output of the high-pass filter 40HP directly connects to the speaker 60, which may be a single speaker or multiple instrument speakers commonly used by the professional musician capable of delivering the desired sonic performance. The embodiment disclosed in FIG. 4 allows the musician to use any desirable instrument amplifier 30F. It is commonly understood in the music industry that most professional musicians believe their best performance will be realized only when playing through a specific and or favorite instrument amplifier and thus the FIG. 4 system allows the musician to use any instrument amplifier of their choice. It will also be apparent that the FIG. 4 system connects to the instrument amplifier 19 via a single speaker connection 90 typical of all instrument amplifiers. Thus the musician may connect multiple active speaker cabinets shown as block 130 to the system by simply observing the minimum impedance specifications of the instrument amplifier used.

Figure 5:
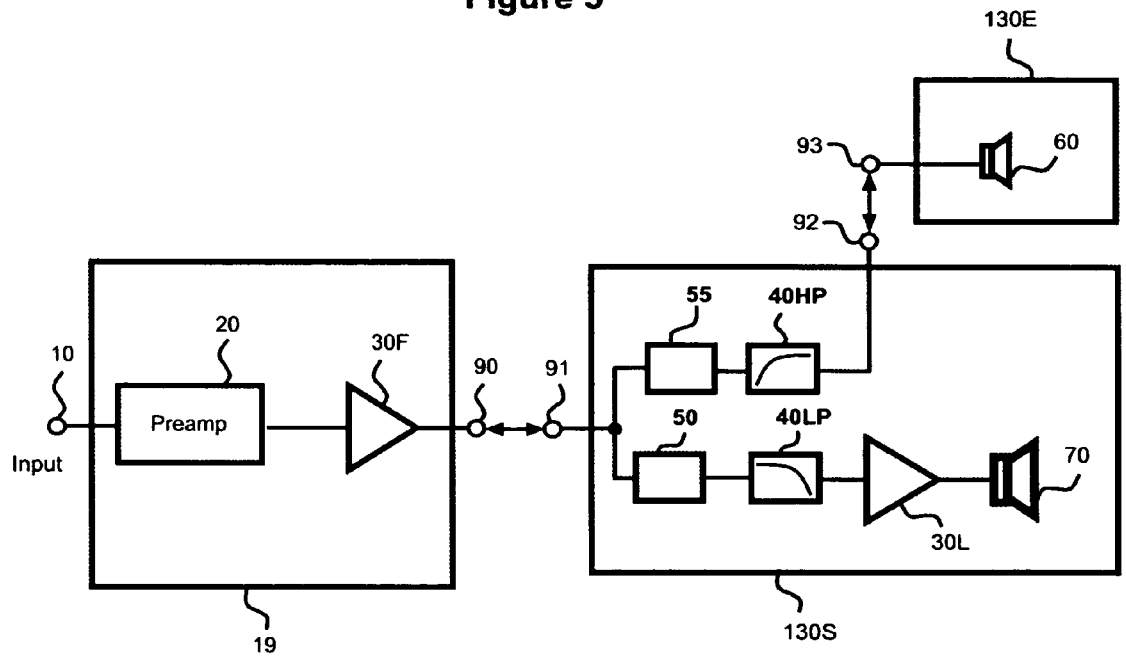
FIG. 5 is a block diagram of a second embodiment of the invention.

Referring now to FIG. 5, a second embodiment of the invention is shown wherein block 19 again represents any common instrument amplifier that the musician may select. Instrument amplifier 19 includes the preamplifier 20 receiving its input signal from the input connector 10. The output of the preamplifier 20 is a full-range signal including the entire spectrum of the signal. The full-range output of the preamp 20 feeds the internal full-range amplifier 30F with the output signal appearing at the output connector 90. The output of the instrument amplifier 19 is connected to the input of the subwoofer speaker 130S via an input connector 91. The input signal at connector 91 is internally connected to both impedance selector switch 55 and the signal attenuator 50. The input signal attenuator 50 can be either a simple single ended attenuator or, as will be described in greater detail with respect to FIG. 6, may alternatively be a differential attenuator allowing the use of instrument amplifiers incorporating a differential or bridge output power amplifier design. Referring again to FIG. 5, the output of the attenuator 50 drives the input of the low-pass filter 40LP. The output of the low-pass filter 40LP is connected to the input of the power amplifier 30L. The output of the internal subwoofer amplifier 30L drives the subwoofer speaker 70. The output of the impedance selector switch 55 is connected to the high-pass filter 40HP, which connects to the output connector 92. The high-pass output appearing at the connector 92 is connected to a separate and self-contained speaker cabinet 130E via the input connector 93. The input connector 93 delivers the signal to the internal speaker or speakers 60. It becomes apparent that the self-contained subwoofer, 130S can be connected to any instrument amplifier 19 selected by the musician and to any extension speaker cabinet 130E thus allowing the musician the ability to use any combination of instrument amplifier and speaker cabinet. The professional musician can also simply connect the self-contained subwoofer system for use with their currently used favorite equipment, thereby allowing low frequency enhancement of their performance. It will also be apparent that multiple subwoofer systems 130S and extension speaker cabinets 130E can be connected to the instrument amplifier 30F within the minimum limits of the amplifier's load impedance. New instrument amplifiers are available that include differential or bridge mode output designs. It will be understood by the skilled artisan that a single ended power amplifier output has two connections, one being ground and the second delivering the actual power amplifiers output voltage swing. It will also be clearly understood to any one skilled in the art that a differential or bridge power amplifier has a signal on both of the two output connections, one being in phase with respect to the input signal and the second one inverted or out of phase with respect to the input signal. A differential bridge output amplifier design can deliver up to 4 times the power to the speaker load with the same power supply rails as the single ended power amplifier. One instrument guitar amplifier incorporating a differential bridge output currently available is the model "THETA" from ISP Technologies. For proper operation, and to avoid shorting one of the output signals to ground, the input attenuator 50 must be a true differential attenuator. By use of a differential attenuator, the full output power of the instrument amplifier incorporating a differential bridge output will be delivered to the standard instrument speakers 60 in FIGS. 4 and 5 and the attenuator 50 will reduce the signal to a line level required to drive the input of the subwoofer amplifier 30L.

Figure 6:
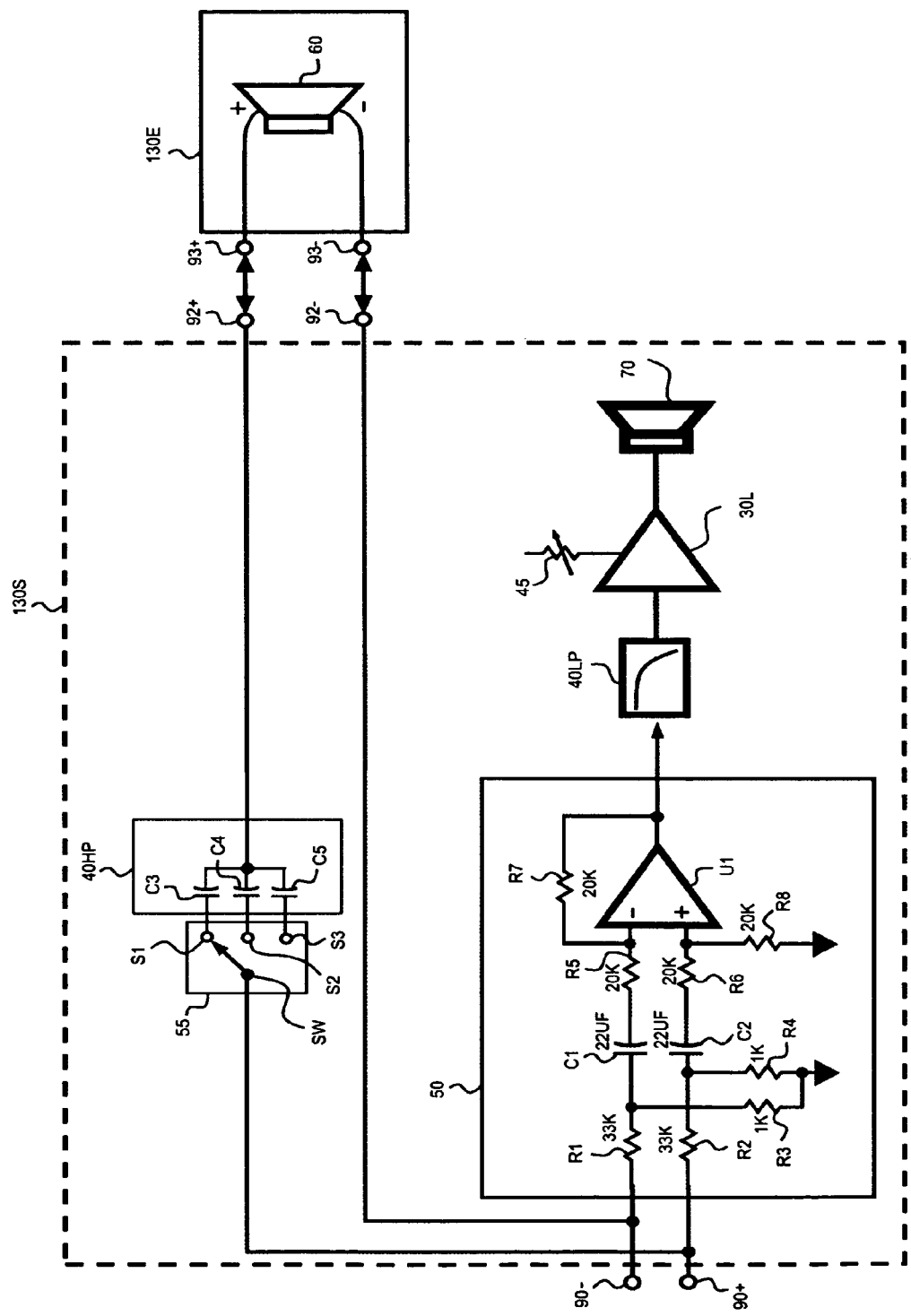
FIG. 6 is a partial schematic diagram, partial block diagram of the embodiment of the invention illustrated in FIG. 5 incorporating a differential high-level attenuator and user selectable impedance crossover switch.

Referring now to FIG. 6, a partial schematic partial block diagram disclosing more details of the embodiment of FIG. 5 is shown. The attenuator block 50 is shown in schematic detail disclosing a differential attenuator input circuit wherein an input signal is applied to the input connector 90+ and 90−. The input 90− is connected to a 33 k ohm resistor R1. Input 90+ is connected to a 33K ohm resistor R2. The opposite end of resistor R1 is connected to 1 k ohm resistor R3, which is connected to a circuit ground reference and to one end of a 22 uf capacitor C1. The second end of resistor R2 is connected to 1 k ohm resistor R4, which is also connected to a circuit ground reference and to one end of a 22 uf capacitor C2. Resistors R1 and R3 form an attenuator for the negative input signal that appears at 90−. Resistors R2 and R4 form an attenuator for the positive input signal that appears at 90+. Capacitors C1 and C2 are used to block any potential DC offset that may appear at the input. U1 is typically a commonly used JFET operational amplifier. U1 and 20 k resistors R5, R6, R7, and R8 form a unity gain differential amplifier circuit. In operation, a differential, high power, speaker level signal from the output of an instrument amplifier is applied to the input connections 90+ and 90− The speaker level signal will be attenuated by approximately 30 db at the output of U1. The output of U1 will be equal to the attenuated difference between the input signals at 90+ and 90−. It will be apparent to anyone skilled in the art that the differential attenuator 50 will allow proper operation with both single ended input signals and differential signals. The differential attenuator 50 will attenuate the input signal from a high-powered amplified level down to typical line level amplitude.

The speaker level input connection 90+ is also connected to the input wiper SW of the impedance selector switch 55. The first output connection S1 of the impedance selector switch 55 is connected to a capacitor C3. The second output connection S2 of the impedance selector switch 55 is connected to a capacitor C4 and the third output connection S3 of the impedance selector switch 55 is connected to a capacitor C5. The second ends of the capacitors C3, C4 and C5 all connect together and also connect to the speaker output connector 92. The selection of capacitor C3, C4 or C5 provides three, speaker level, user selectable crossovers at a typical crossover frequency between 80 Hz and 200 Hz. The most common extension speaker cabinets are either 16 ohms, 8 ohms or 4 ohms impedance. The impedance selector switch 55 and the high-pass filter capacitors C3, C4 and C5 allow the same crossover frequency to be realized with the 3 most common extension speaker impedances. It will be apparent that other crossover frequencies may be used without departing from the scope of the invention. Referring again to FIG. 6, the output of the high-pass filter 40HP connects to the positive output connection 92+. The negative input connection 90−, which receives the speaker level output of the instrument amplifier, is directly connected to the negative speaker output connector 92−. An external extension speaker cabinet 130E is connected via connections 93+ and 93− to output connections 92+ and 92−, respectively. The external extension speaker 130E contains either a single speaker or multiple instrument speakers 60. The output of the attenuator block 50 feeds the input of the low-pass filter 40LP, which can be a single pole 6 db per octave design or a higher order filter. The output of the low-pass filter 40LP drives the input of the internal subwoofer power amplifier 30L. The system also includes a level control 45, which adjusts the level of the power amplifier 30L. The level control 45 is a user adjustment allowing the musician to adjust the output level of the subwoofer to their preference. The output of the subwoofer amplifier 30L drives the internal subwoofer speaker 70. In operation, stand-alone subwoofer system 130S is a fully self-contained subwoofer system that can be connected to any existing instrument amplifier and speaker cabinet. The instrument amplifier drives the external extension speaker after passing though user selectable impedance selector/high-pass crossover 55 and 40HP. The speaker level input signals at 90+ and 90− get attenuated by differential attenuator 55, providing a line level signal and driving the input of low-pass filter 40LP. The line level output of the low-pass filter 40LP connects to the input of the internal subwoofer amplifier 30L and drives the internal subwoofer speaker 70. The subwoofer speaker 70 is typically a 15-inch speaker but may be any speaker designed to produce a high level output at the frequency range desired between 20 Hz and 200 Hz. The output level of the subwoofer system is user adjustable via the level control 45.

Thus it will be apparent that there has been provided, in accordance with the invention, an active instrument subwoofer system for low frequency enhancement that fully satisfies the objects, aims and advantages set forth above. While the invention has been described in conjunction with specific embodiments thereof, it is evident that many alternatives, modifications and variations will be apparent to those skilled in the art and in light of the foregoing description. Accordingly, it is intended to embrace all such alternatives, modifications and variations as fall within the spirit of the appended claims.

What is claimed is:

1. A method of enhancing the low frequency audio components of musical instrument power amplifier output signal comprising the steps of:
   high-pass filtering the musical instrument power amplifier output signal to provide a first filtered signal;
   applying the first filtered signal to an instrument speaker;
   attenuating the musical instrument power amplifier output signal to produce a line level signal;
   low-pass filtering the line level signal to provide a second filtered signal;
   amplifying the second filtered signal to provide an amplified filtered signal; and
   applying the amplified filtered signal to a low frequency speaker.

2. A system for enhancing the low frequency audio components of musical instrument power amplifier output signal comprising:
   means for high-pass filtering the musical instrument power amplifier output signal to provide a first filtered signal;
   an instrument speaker receiving said first filtered signal;
   means for attenuating the musical instrument power amplifier output signal to produce a line level signal;
   means for low-pass filtering said line level signal to provide a second filtered signal;
   means for amplifying said second filtered signal to provide an amplified filtered signal; and
   a low frequency speaker receiving said amplified filtered signal.

3. A system according to claim 2, said high-pass filtering means having an impedance matched to an impedance of said instrument speaker at an output of the musical instrument power amplifier.

4. A system according to claim 2, said attenuating means comprising a differential attenuator.

5. A system according to claim 2 further comprising means for adjusting said amplified filtered signal.

6. A system according to claim 2, said high-pass filtering means having an impedance matching a cross-over point of an external speaker with a low-pass filter point of a low frequency subwoofer.

* * * * *